United States Patent [19]

Kruzich

[11] 4,164,071
[45] Aug. 14, 1979

[54] METHOD OF FORMING A CIRCUIT BOARD WITH INTEGRAL TERMINALS

[75] Inventor: Joseph K. Kruzich, Ann Arbor, Mich.

[73] Assignee: Ford Motor Company, Dearborn, Mich.

[21] Appl. No.: 865,035

[22] Filed: Dec. 27, 1977

[51] Int. Cl.² .................. H05K 3/04; H05K 3/22
[52] U.S. Cl. .................. 29/625; 174/68.5; 339/17 LC; 156/223; 156/226; 156/227; 156/268
[58] Field of Search .................. 29/625; 174/68.5; 339/17 LC; 156/223, 226, 227, 267, 268, 251, 261

[56] References Cited

U.S. PATENT DOCUMENTS

| | | | |
|---|---|---|---|
| 2,647,852 | 8/1953 | Franklin | 156/261 |
| 2,753,619 | 7/1956 | Franklin | 156/251 |
| 3,302,067 | 1/1967 | Jackson et al. | 361/414 |
| 3,474,297 | 10/1969 | Bylander | 174/68.5 |
| 3,573,345 | 4/1971 | Devries | 29/628 |
| 3,694,660 | 9/1972 | LaBranche et al. | 29/625 |
| 3,698,079 | 10/1972 | Lifschitz | 29/625 |
| 3,723,635 | 3/1973 | Smith | 29/625 |
| 3,898,535 | 8/1975 | Ebbert | 174/68.5 |
| 3,911,716 | 10/1975 | Weglin | 29/625 |

FOREIGN PATENT DOCUMENTS

| | | | |
|---|---|---|---|
| 251384 | 5/1963 | Australia | 29/625 |
| 1590738 | 4/1970 | Fed. Rep. of Germany | 29/625 |
| 2029235 | 12/1971 | Fed. Rep. of Germany | 29/625 |
| 668305 | 3/1952 | United Kingdom | 156/226 |
| 1444554 | 8/1976 | United Kingdom | 29/625 |

Primary Examiner—Francis S. Husar
Assistant Examiner—Daniel C. Crane
Attorney, Agent, or Firm—Paul K. Godwin, Jr.; Clifford L. Sadler

[57] ABSTRACT

A circuit board having a die stamped conductive pattern is produced having terminals which are integral with the conductive pattern on the board. A first embodiment is produced by folding the conductive material over a designated terminal edge of the board to obtain commonly connected terminals on opposite sides of the board. The second embodiment is produced by extending the conductive material past the terminal edge of the board and folding the material 180° to obtain an integral blade terminal extending from the board.

5 Claims, 6 Drawing Figures

METHOD OF FORMING A CIRCUIT BOARD WITH INTEGRAL TERMINALS

BACKGROUND OF THE INVENTION

1. Field of the Invention

The present invention is related to the manufacturing of die stamped electrical circuit boards.

2. Description of the Prior Art

In the prior art, circuit boards are generally constructed from a substrate with conductive material laminated thereon and either etched or die stamped to form a desired circuit pattern. In some cases, the circuit boards have a portion of the substrate formed to define a blade portion upon which terminal conductors are formed to supply the various electrical connections to the circuit board.

U.S. Pat. No. 3,522,485 illustrates a circuit board having individual blade terminals formed thereon with a corresponding conductive pattern laminated on each terminal.

In U.S. Pat. No. 3,546,539, a single terminal portion of a board is shown having a plurality of conductive lands formed thereon. The conductive lands are formed on opposite sides of the board and may be jumpered together by soldering a jumper wire to correspondingly opposite lands through an aperture in the board.

It is further known that some heavy duty circuit boards have separate blade terminal elements which are riveted, or otherwise permanently fastened to the circuit boards. The blade terminal elements provide individual blade terminals extending from the boards to mate with female electrical receptacles. Such circuit boards inherently require additional manufacturing steps, which may add to the cost.

SUMMARY OF THE INVENTION

The present invention is intended to provide an improved circuit board production method, whereby integral terminals are formed on a plug-in type electrical circuit board by folding the conductive laminating material over the terminal edge of the circuit board prior to curing the laminating adhesive.

The first embodiment of the invention results in corresponding terminals being formed on opposite sides of the circuit board substrate and commonly connected, since they are integral.

The second embodiment results in the formation of individual flat blade terminals, which are connected to opposite sides of the circuit board substrate and are integral with the conductive material forming the conductive pattern of the board.

It is an object of the present invention to provide an improved method of forming electrical circuit boards.

It is another object of the present invention to provide an improved method of forming electrically conductive terminals on opposite sides of a circuit board substrate.

It is a further object of the present invention to provide an improved method of forming blade terminals which extend from a terminal edge of the circuit board substrate and are integral with the conductive pattern formed thereon.

BRIEF DESCRIPTION OF THE DRAWINGS

The above stated objects and following description can be better understood by referring to the appended drawings, of which.

DETAILED DESCRIPTION OF THE PREFERRED EMBODIMENTS

Figure 1:
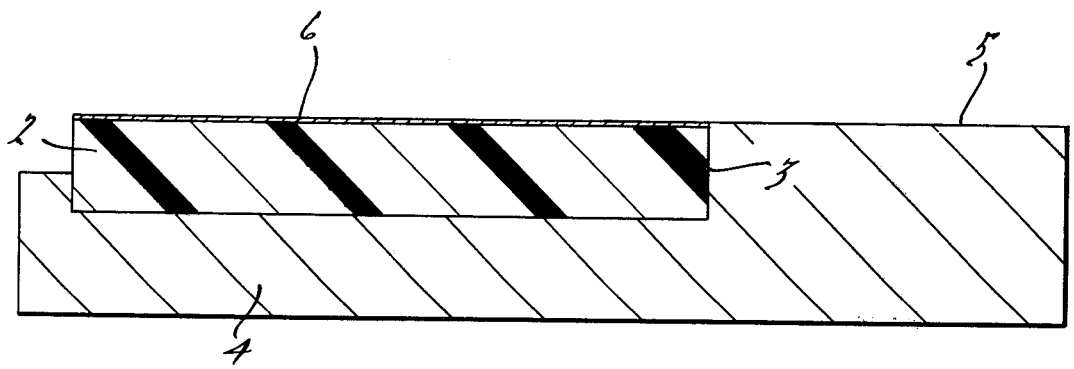
FIG. 1 illustrates a circuit board substrate seated in a holding fixture prior to formation of a circuit pattern thereon.
Figure 2:
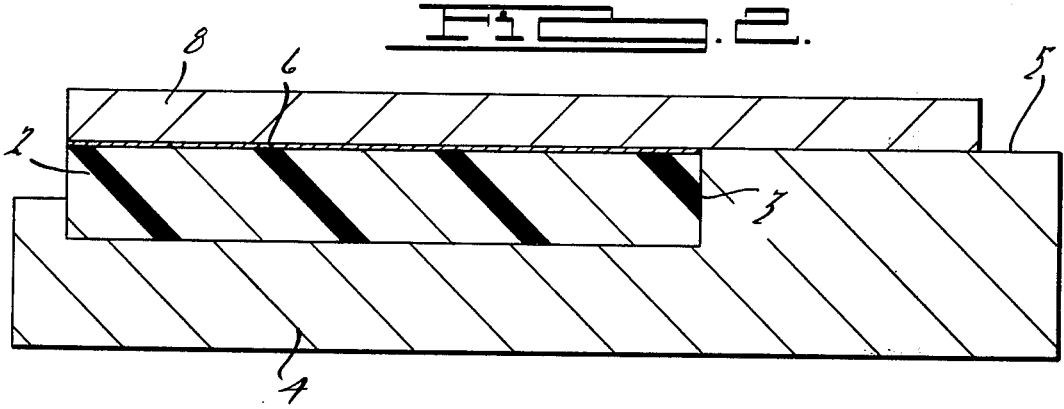
FIG. 2 illustrates the additional lamination of the conductive material on the circuit board substrate in order to form the first embodiment of the invention.
Figure 3:
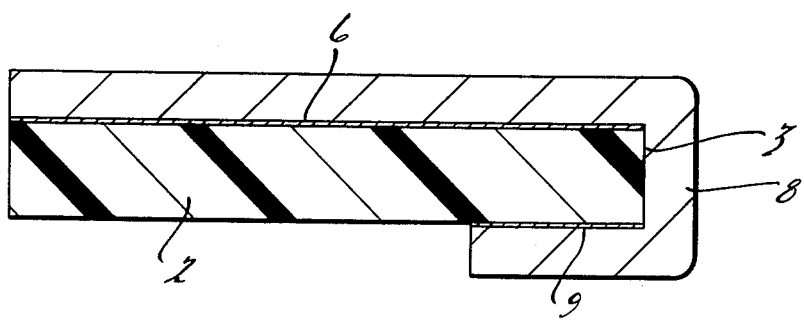
FIG. 3 illustrates the formation of the opposing conductive terminals of the first embodiment of the invention.

A first embodiment of the present invention is shown in FIG. 3, which results from a manufacturing method as represented in FIGS. 1 and 2.

In the first embodiment of the present invention, it is an object to provide electrically conductive terminals on opposite sides of a circuit board substrate so that the opposing terminals are electrically connected together. This first embodiment is achieved by a novel method, which is fully described below. A provided circuit board substrate 2 is placed in a holding fixture 4 so that a designated terminal edge 3 of the board 2 is adjacent a surface 5. The holding fixture 4 has an upper surface 5 which is at substantially the same level as the upper surface of the substrate 2.

An uncured adhesive 6 is then deposited over the upper surface of the substrate 2, to provide the subsequent bonding of the laminate circuit board structure. The uncured adhesive 6 may be deposited in a continuous layer over the substrate 2 or in a pattern corresponding to the desired circuit board conductor pattern to be formed on the substrate 2.

An electrically conductive foil layer 8, such as copper or other commonly used materials, is deposited over the uncured adhesive 6 so as to extend past the terminal edge 3 of the substrate 2 onto the upper surface 5 of the holding fixture 4.

While the substrate 2 is in the holding fixture 4, a predetermined conductor pattern is die stamped so as to define linear terminal portions in the conductive material 8 on the substrate 2 and in the material 8 extending over the surface 5 of the holding fixture 4. The unwanted portions of the conductive material 8 are then removed to thereby leave the desired conductor pattern on the substrate 2.

The uncured laminated structure is then separated from the holding fixture 4 so that an uncured adhesive layer 9 may be deposited on the lower surface of the substrate 2 adjacent the edge 3. The conductive material 8 extending past the terminal edge 3 of the substrate 2 is then folded over the terminal edge 3 so that it contacts the uncured adhesive layer 9. At that point, the laminated structure is compressed and cured so as to form a permanent bond between the conductive material 8 and the surfaces of the substrate 2.

The second embodiment of the present invention is formed by a method essentially identical to that used to form the first embodiment, with the exception of the length of conductive material extending over the terminal edge of the substrate and the details of the folding step.

Figure 4:
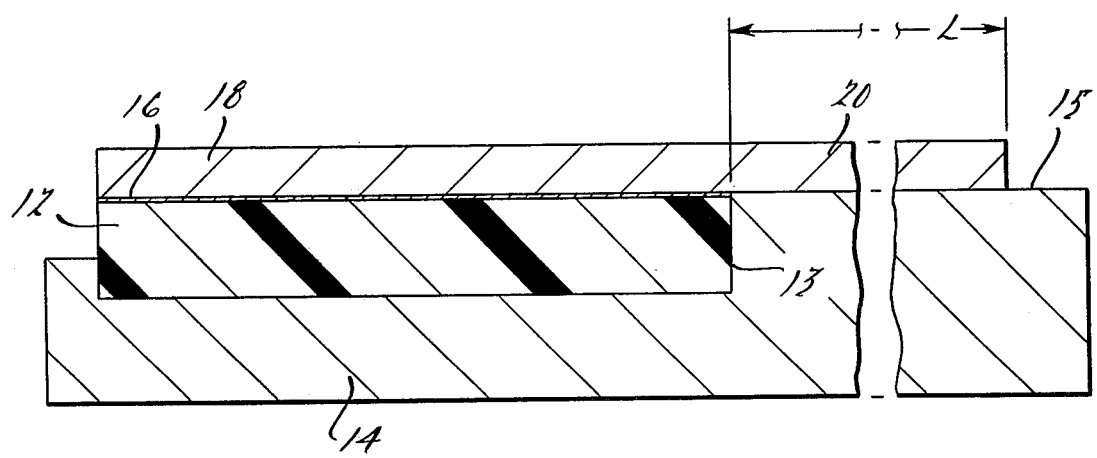
FIG. 4 illustrates the lamination procedure for forming the second embodiment of the present invention.
Figure 5:
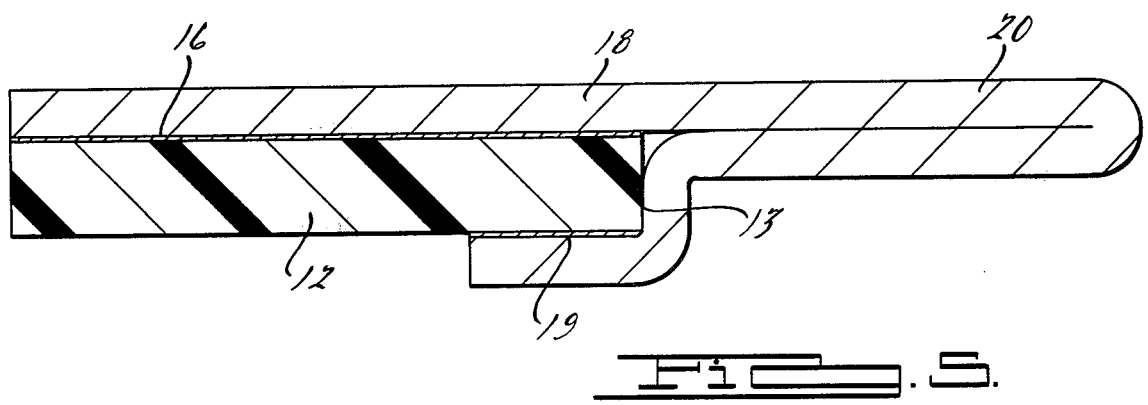
FIG. 5 illustrates the formation of the integral blade terminal of the second embodiment.
Figure 6:
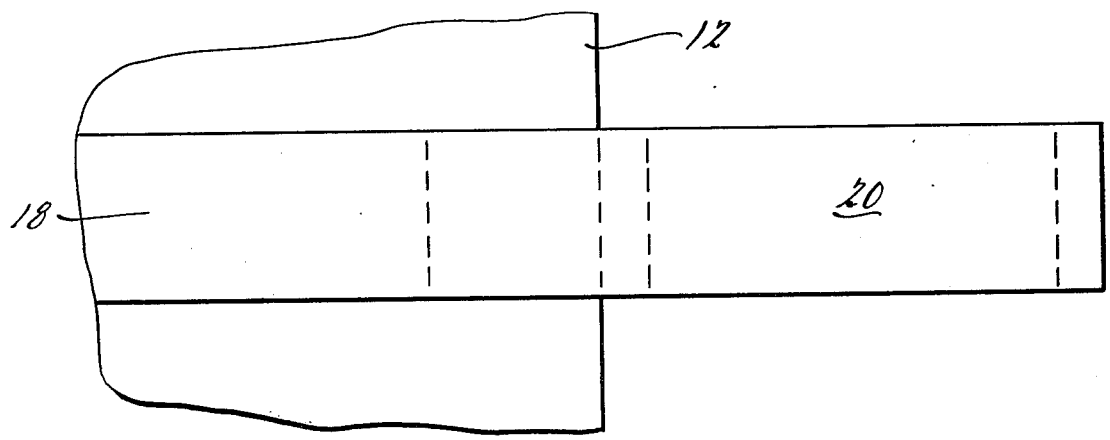
FIG. 6 is a top plan view of the integral blade terminal shown in FIG. 5.

In forming the second embodiment of the invention, a circuit board substrate 12 is placed in a holding fixture 14, similar to the holding fixture 4 shown in FIG. 4. The holding fixture 14 has an upper surface 15 which extends coplanar with the upper surface of the circuit board substrate 12. The circuit board substrate 12 is placed in the holding fixture 14 so that a terminal edge 13 is adjacent the upper surface 15 of the holding fixture 14. An uncured adhesive layer 16 is deposited on the upper surface of the circuit board substrate 12. A conductive material layer 18, such as copper or other commonly used materials, is placed on the uncured adhesive layer 16 so as to extend at least a distance L past the terminal edge 13 and onto the upper surface 15 of the holding fixture 14. The distance L is greater than twice the length of the desired blade terminal which will be formed as a result of the present method.

While in the holding fixture 14, the conductive material 18 is die stamped so as to define a desired electrical conductor pattern including several elongated terminal portions 20 integrally extending the distance L beyond the terminal edge 13 of the substrate 12. Following the die stamp step, the undesired portions of the conductive material 18 are removed and the portions 20 having a length L extending beyond the edge 13 of the substrate 12, are folded 180° so as to define the blade terminals.

The die stamped structure is then removed from the fixture 14 and an uncured adhesive layer 19 is deposited on the opposite surface of the substrate 12 coincident with the overlapping of the portion 20. The portion 20 of the conductive material 18 is then folded back on itself to form the integral blade terminals, so that the extreme end of the portion 20 overlaps the opposite side of the substrate 12.

Subsequently, the laminate structure, having the blade terminals formed as an integral part thereof, are compressed and heated in order to cure the adhesive and form a composite laminate structure.

It is apparent, that the thickness of the conduction material 18, as well as the particular type of material employed, will determine the rigidity and durability of the integral blade terminals in the second embodiment. Therefore, where relatively soft electrically conducting material is selected for the layer 18, a substrate material can be used to support individual blade terminals by folding the portion 20 over the support substrate in a manner similar to that described in the first embodiment and shown in FIG. 3.

It will be apparent that many modifications and variations may be effected without departing from the scope of the novel concept of this invention. Therefore, it is intended by the appended claims to cover all such modifications and variations which fall within the true spirit and scope of the invention.

I claim:

1. A method of integrally forming common electrically conductive blade terminals connected to opposite sides of a printed circuit board, including the steps of:
   providing a substrate board;
   providing a holder for said board having one exposed surface extending outward from at least one edge of said board;
   depositing a layer of uncured adhesive on the exposed surface of said board;
   depositing a layer of conductive material on said layer of uncured adhesive, so as to extend a portion of said material outward a predetermined distance from said edge over said exposed surface of said holder;
   die stamping said layer of conductive material to form a conductor pattern and linear terminals on said board and die stamping said portion of said conductive layer outward from said edge to form linear extensions of said linear terminals;
   depositing a second layer of uncured adhesive to a portion of the opposite surface of said board adjacent said edge;
   folding said linear extensions through 180°, at a first distance from said edge wherein said first distance being such that said fold is in a noncontacting relationship with said edge and said first distance is less than half said predetermined distance of linear extension from said edge, so as to overlap said second adhesive layer with the remainder of said folded linear extensions to integrally form said blade terminals; and
   curing said adhesive layers.

2. A method as in claim 1, wherein said conductive layer is a metal foil and said step of die stamping removes unwanted foil from said board while leaving the desired conductor pattern.

3. A method of producing a plug-in type printed circuit board having integral blade terminals extending from an edge thereof, including the steps of:
   providing a substrate board;
   providing a holder, for said substrate board, having an exposed surface extending from a desired terminal edge of said board;
   applying an uncured adhesive layer over the surface of said board;
   applying a layer of conductive material having a single thickness on said layer of uncured adhesive and extending said application of said conductive layer at least a predetermined distance beyond said terminal edge over said exposed holder surface;
   forming a conductor pattern on said board so as to define single thickness linear elements extending said predetermined distance from said terminal edge;
   folding said linear elements at a point less than half said predetermined distance from said edge back towards said edge, said fold being made at a point in noncontacting relationship with said edge to define linear extending blade terminals having twice the thickness of said conductive layer and having a single thickness remainder overlapping the opposite side of said board;
   connecting the remainder of said folded linear elements to the opposite side of said board; and
   curing said adhesive layer.

4. A method as in claim 3, wherein said step of forming said conductor pattern is performed by die stamping and removing undesired portions of said conductive layer.

5. A method as in claim 4, wherein said step of connecting is performed by applying a second layer of uncured adhesive material to said opposite side of said board, and holding said ends against said second layer prior to said curing step.

* * * * *